United States Patent
Chen et al.

(10) Patent No.: US 7,714,596 B2
(45) Date of Patent: May 11, 2010

(54) SYSTEM AND METHODS OF MEASURING SEMICONDUCTOR SHEET RESISTIVITY AND JUNCTION LEAKAGE CURRENT

(75) Inventors: James T. C. Chen, San Mateo, CA (US); Dimitar B. Dimitrov, Hayward, CA (US)

(73) Assignee: Four Dimensions Inc., Hayward, CA (US)

( * ) Notice: Subject to any disclaimer, the term of this patent is extended or adjusted under 35 U.S.C. 154(b) by 347 days.

(21) Appl. No.: 12/002,095

(22) Filed: Dec. 14, 2007

(65) Prior Publication Data

US 2008/0143354 A1    Jun. 19, 2008

Related U.S. Application Data

(60) Provisional application No. 60/875,060, filed on Dec. 15, 2006.

(51) Int. Cl.
*G01R 31/02* (2006.01)
(52) U.S. Cl. .................. 324/715; 324/716
(58) Field of Classification Search ......... 324/713–716, 324/719
See application file for complete search history.

(56) References Cited

U.S. PATENT DOCUMENTS

| | | | |
|---|---|---|---|
| 5,691,648 A * | 11/1997 | Cheng | 324/716 |
| 6,218,846 B1 * | 4/2001 | Ludwig et al. | 324/713 |
| 6,943,571 B2 * | 9/2005 | Worledge | 324/719 |
| 7,019,513 B1 | 3/2006 | Faifer et al. | |

* cited by examiner

*Primary Examiner*—Vincent Q Nguyen
(74) *Attorney, Agent, or Firm*—NewTechLaw; Gerald B. Rosenberg, Esq.

(57) ABSTRACT

Sheet resistance, junction leakage and contact conductivity of a semiconductor layer, associated with an ultra-shallow junction layer or metal film are measured by contacting the surface with a plurality of probes. The probes can be used, in conjunction with a four-point probe system, to determine sheet resistivity. Junction leakage through an ultra-shallow junction is determined by establishing a reverse bias across the junction set at a predetermined voltage value, measuring through a first probe a total junction current conduction value, measuring through second, third, and fourth probes a plurality of voltage values. The junction leakage value is then directly computed based on the sheet resistivity value, reverse bias potential, wafer radius, and the measured voltage values. Contact conductivity between a metal film and semiconductor layer can be similarly directly computed.

17 Claims, 2 Drawing Sheets

SYSTEM AND METHODS OF MEASURING SEMICONDUCTOR SHEET RESISTIVITY AND JUNCTION LEAKAGE CURRENT This application claims the benefit of U.S. Provisional Application No. 60/875,060, filed Dec. 15, 2006.

BACKGROUND OF THE INVENTION

1. Field of the Invention

The present invention is generally related to semiconductor manufacturing test measurement systems and, in particular, to the measurement of sheet resistance and junction leakage associated with p-n junctions and conductivity associated with metal films.

2. Description of the Related Art

The active elements of semiconductor devices within an integrated circuit (IC) are constructed in a succession of semiconductor layers, variously created using deposition and ion implantation process steps, and metal film depositions. These layers, particularly including implanted layers, are sensitive to fabrication-dependent process variables. In order to obtain appropriate electrical performance and process yield, implant fabricated layers must be highly uniform, both physically and electrically. Historically, implanted surface layers have been required to have a minimum and narrowly controlled range of sheet resistivity, $\rho_s$, across the surface of a wafer. Metal films are similarly required to have well-controlled film to semiconductor conductivity. Various test devices, including those known as four-point probe measurement devices have been used to measure the value and uniformity specifically of sheet resistivity.

The physical size of semiconductor devices has and will continue to shrink in an effort to improve integrated circuit speed and reduce power consumption. As fabricated active element areas shrink, the depth of the surface layer that contains the active drain and source implant regions, as well as other active regions, must also be decreased. Otherwise, operation of the active elements will become dominated by known short channel and other undesirable effects. A thin surface layer of less than about 500 angstroms can be created using low energy ion implantation followed by a spike or flash annealing, often on the order of one second or less. Such layers are conventionally known as ultra shallow junction (USJ) layers.

Precise production of the thin active element surface USJ layer is essential. Of particular concern is the level of junction leakage current through the ultra shallow junction. In conventional construction, a portion of fabricated drain regions will be defined by the USJ. Lower leakage levels, representing reduced device localized heat generation and overall power consumption, are desired. Given that the active surface layer implantation is performed early in the production of integrated circuits, accurate in-process measurement of both sheet resistivity and junction leakage is particularly desired to avoid the further production cost and time for circuits that will not perform acceptably as finally manufactured.

Another critical processing step occurs with the implantation of heavily doped local regions, commonly referred to as HALO implantations, to control and reduce short-channel effects between source and drain regions. Due to the high doping levels associated with HALO implantations, typically in the range of about $2 \times 10^{18}$ to $2 \times 10^{18}$ dopants/cm$^3$, the leakage current at the associated ultra-shallow junction can be significantly increased. In-process control of the sheet resistivity and junction leakage properties is therefore highly desirable for HALO implanted USJ layers.

A recent method for in-process monitoring of USJ and HALO implanted layers utilizes a non-contact photo-voltaic propagation measurement to infer sheet resistance and leakage current is disclosed in U.S. Pat. No. 7,019,513, issued to Faifer et al. Non-contact is desirable for a number of reasons, including a high test-point rate and reduced measurement damage. Photo-voltaic inducement techniques do, however, have some disadvantages. The physical nature of photo-exited carriers will produce a forward bias across the p-n USJ layer to substrate junction in the range of tens of millivolts. In normal operation, this junction will be reverse biased typically in the range of several hundreds of millivolts to several volts. Test and operation regimes are therefore quite different. Further, in the absence of any actual surface contact, sheet resistivity and junction leakage must be indirectly inferred based on the propagation and attenuation of a indirectly sensed photo induced voltage. Consequently, measurement accuracy as well as the available measurement range of sheet resistance will be limited. The absence of any bias control makes measurement accuracy of junction leakage currents even less accurate. Even then, the photo-induced forward bias precludes any meaningful measurement of the junction leakage contribution due to tunning under reverse bias, as will be encountered in normal operating conditions.

SUMMARY OF THE INVENTION

The general purpose of the present invention is to provide a highly accurate test system and methods of measuring certain semiconductor junction layer properties including sheet resistance, junction leakage, and conductivity.

This is achieved in the present invention by providing a system and methods of measuring sheet resistance, junction leakage, and conductivity associated with a semiconductor layer or other layer by contacting a surface metal film or semiconductor layer with a plurality of probes. The probes can be used, in conjunction with a four-point probe analysis system, to determine a sheet resistivity value. Junction leakage through a junction formed between semiconductor layers is determined by establishing a reverse bias across the junction set at a predetermined voltage value, measuring through a first probe a total junction current, measuring through second, third, and fourth probes a plurality of voltage values. The junction leakage value is then directly computed based on the sheet resistivity value, reverse bias potential, and the measured voltage values.

An advantage of the present invention is that the present junction leakage measurement system enables test parameters to be explicitly set and the direct measurement of meaningful current and voltage levels. These parameters include the junction bias potential, which can be both explicitly set and, further, precisely varied for evaluating different operating regimes. The available bias potential range includes the full range of reverse junction bias potentials likely be encountered in expected integrated circuit operation. Direct measurement of operating potentials and currents also enables realization of a high degree of test accuracy, particularly with regard to the sheet resistivity, junction leakage current and conductivity.

Another advantage of the present invention is that the test system and methods can be utilized to measure a variety of performance related parameters. In addition to sheet resistivity and junction leakage, the system and methods can directly measure the contact resistivity of a superficial metal film, such as a metal silicide conductor, to the underlying semiconductor layer, and contact resistance of an applied electrode to an underlying ion-implanted layer.

DETAILED DESCRIPTION OF THE INVENTION

Figure 1:
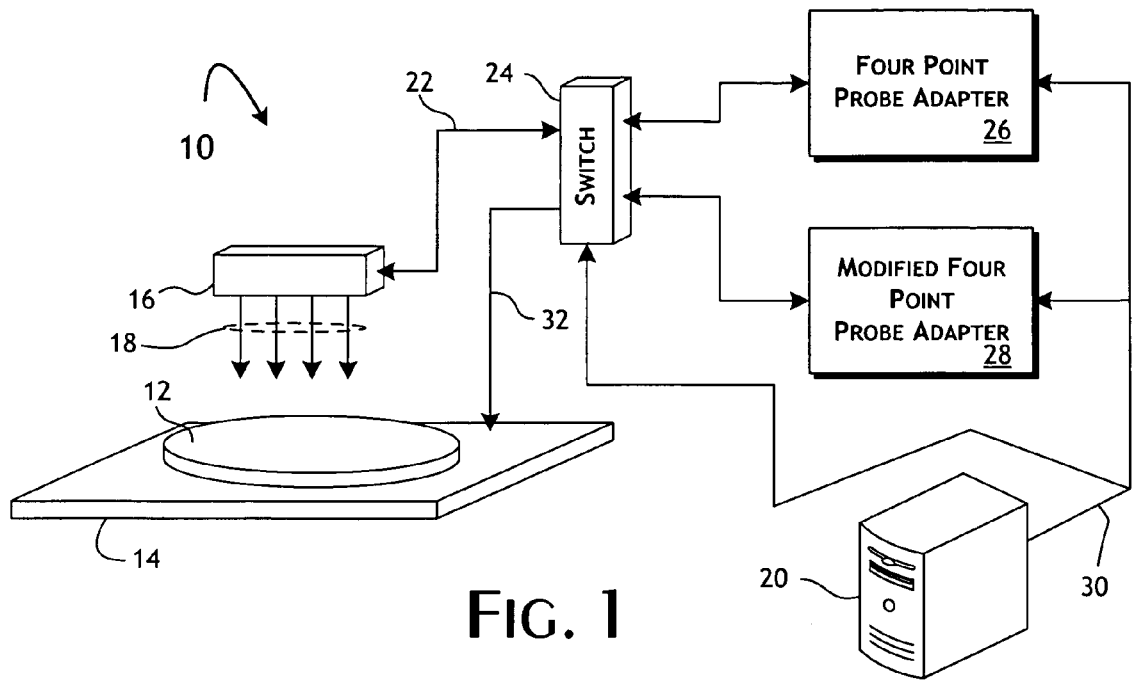
FIG. 1 presents a system diagram illustrating a semiconductor wafer test and measurement system employing a four-point probe tool modified for use in accordance with the present invention.

The present invention provides for the direct measurement of a variety of semiconductor junction related properties important in the in-process production characterization of semiconductor layers. At present, the principal value of the present invention is perceived to be the accuracy and ease of measurement of sheet resistivity and junction leakage current associated with ultra shallow junction (USJ) ion implanted surface layers. While the following discussion will be principally directed to this application, further uses and benefits of the present invention are fully contemplated. In particular, contact resistivity of surface films, including metal and metal silicide films, can be measured by the present invention. In the following detailed description of the invention like reference numerals are used to designate like parts depicted in one ore more of the figures.

Referring to FIG. 1, a four-point probe test measurement system 10, incorporating modifications in accordance with the present invention, is shown. A test wafer 12 is mounted on an x-y servo-controlled platform, or chuck, 14, allowing repositioning of the wafer 12 in coordination with a z-axis servo-controlled probe assembly 16, mounting contact probes needles 18 in precise mechanical array. Servo operation is controlled by a local test measurement and control computer 20 through servo control connections not shown. Electrical lines 22 to the probe needles 18 are distributed separately through a switch 24 to a conventional four-point probe adapter 26 and a modified four-point probe adapter 28. The computer 20 is connected to the adapters 26, 28 through a control and data bus 30 for the receipt of measurement data and provision of control signals. In addition, the control and databus 30 is connected to the switch 24 to enable control of the measurement data routing selection by the computer 20 and to control application of a bias voltage to the wafer 12 through a line 32 connected in the preferred embodiment to the platform 14.

Figure 2:
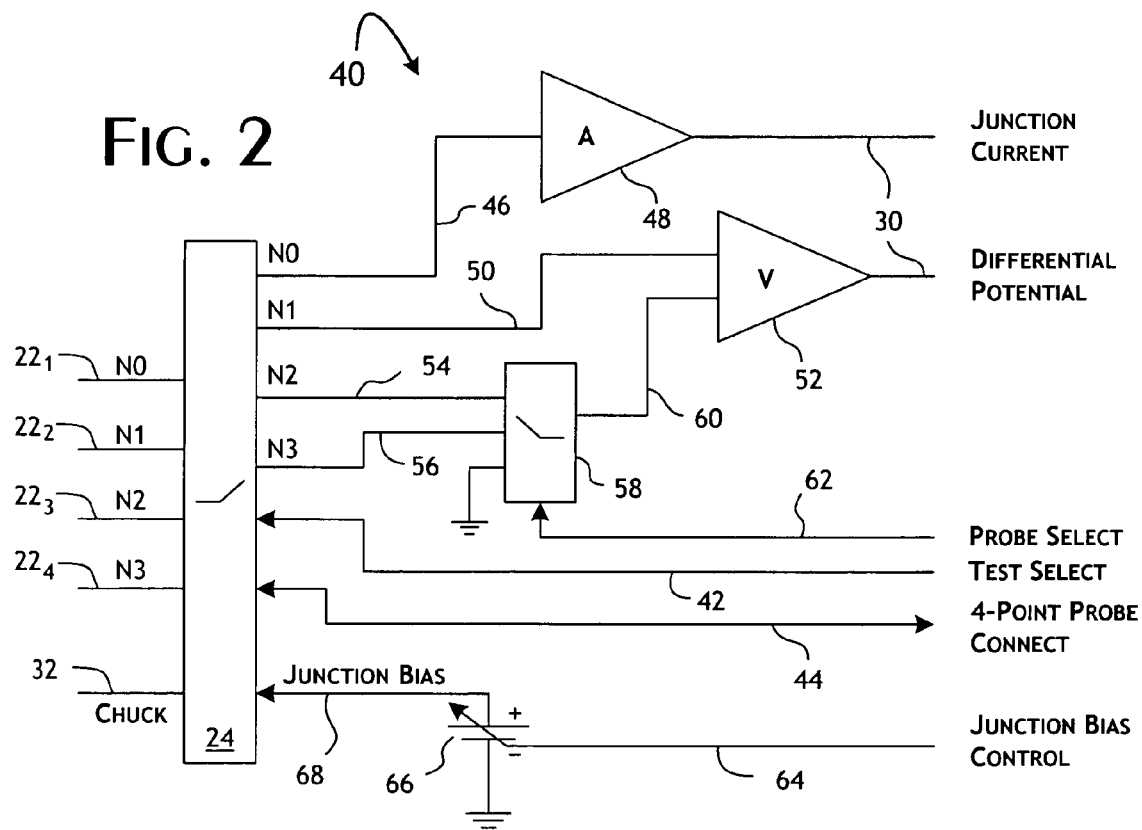
FIG. 2 is a schematic block diagram illustrating a modified four-point probe hardware adapter implemented in a preferred embodiment of the present invention.

A modified four-point probe adapter system 40, constructed in accordance with a preferred embodiment of the present invention, is shown in FIG. 2. Under control of the computer 20, through control line 42, N0-N3 probe lines $22_{1-4}$ are connected either to the conventional four-point probe adapter 26, via lines 44, or to the modified four-point probe adapter 28. In the preferred embodiment, the N0 probe line $22_1$ is connected through the switch 24 and N0 line 46 to a precision current integrator 48 implemented as part of the modified four-point probe adapter 28. The output of the integrator 48 is an analog to digital converted value. The N1 probe line $22_2$ is connected through line 50 to a first input of a precision differential voltage amplifier 52 also implemented as part of the modified four-point probe adapter 28. The N2 and N3 probe lines $22_3$, $22_4$ are connected through lines 54, 56, a switch 58, and line 60 to the second input of the precision differential voltage amplifier 52. A control line 62 of the control and databus 30 allows selection of either the N2 or N3 signal, allowing for a differential measurement of the potential between either the N1 and N2 probe lines $22_2$, $22_3$ and the N1 and N3 probe lines $22_2$, $22_4$, or ground, allowing for an absolute measurement of the potential on the N1 probe line $22_2$. The output of the amplifier 52 is an and analog to digital converted value. A separate control line 64 allows computer 20 digital control of a precision voltage supply 66 used to supply a junction bias voltage through line 68 and the switch 24 to the bias line 32. The connection of the junction bias line 68 to the bias line 32 is open circuited when the switch 24 is selected for the conventional four-point probe adapter 26.

Figure 3:
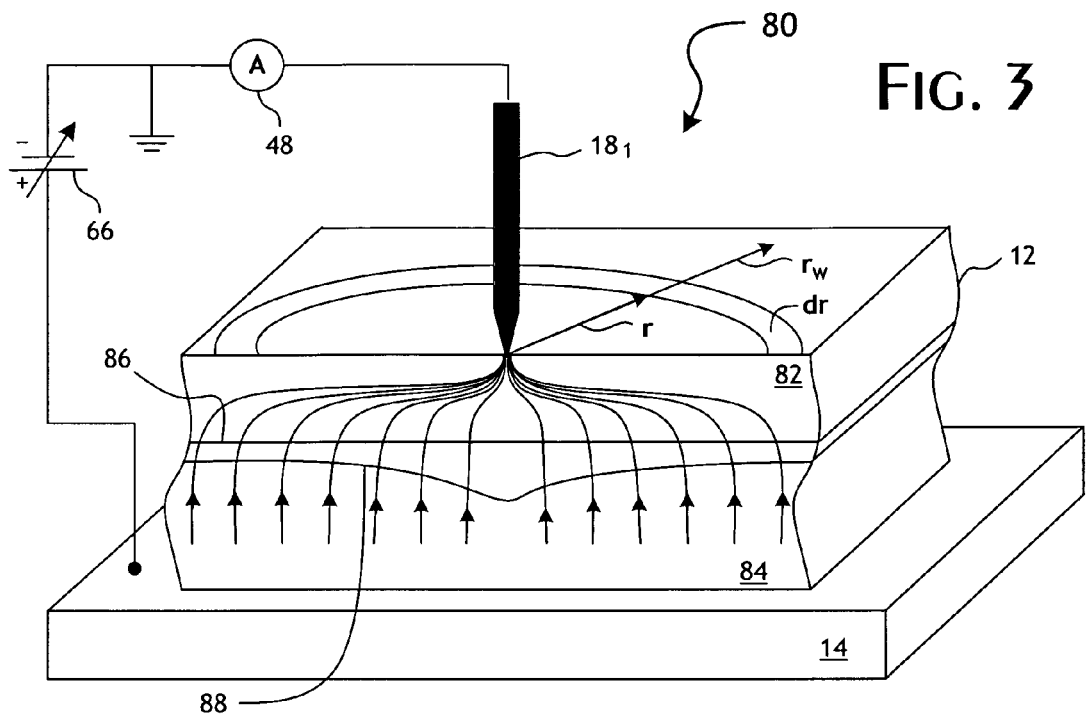
FIG. 3 provides a first isometric view of a wafer mounted for test and measurement of junction leakage in accordance with the present invention.

FIG. 3 provides a partial view 80 of a wafer 12 mounted on the test platform 14. The wafer 12, as shown, has an ion implanted layer 82 formed on a substrate 84 of opposite type. A probe needle $18_1$ is presented in contact with the exposed surface of the implanted layer 82. A reverse bias potential 66 is applied to the substrate 84 and the return current is measured 48. A concentric distribution of current will leak through the junction 86 formed between the implanted layer 82 and substrate 84. The depletion layer across the junction will be subject to a varying radial distribution 88, as generally indicated in FIG. 3. The radial current-voltage distribution relationship can be expressed as:

$$\frac{dI_l(r)}{dr} = -\sigma_J 2\pi r V(r) dr \qquad \text{Eq. 1a}$$

and $$\frac{dV(r)}{dr} = -\frac{\rho_S}{2\pi r} I_l(r) dr \qquad \text{Eq. 1b}$$

where $I_l(r)$ is the total current flow toward the probe needle $18_1$ tip at a circumference of radius r from the contact point, where V(r) is the voltage between the implanted layer 82 and the substrate 84 at the same circumference, where $\rho_S$ is the sheet resistivity of the implanted layer 82 at r, and where $\sigma_J$ is the conductivity of the junction.

The expressions in equations Eq. 1a and 1b can be converted into a differential equation set as:

$$\frac{d^2 V(r)}{dr^2} + \frac{1}{r}\frac{dV(r)}{dr} - \rho_S \sigma_J V(r) = 0 \qquad \text{Eq. 2}$$

and $$\frac{d^2 I_l(r)}{dr^2} - \frac{1}{r}\frac{dI_l(r)}{dr} - \rho_S \sigma_J I_l(r) = 0 \qquad \text{Eq. 3}$$

The equations Eq. 2 and Eq. 3 can be solved for V(r) as:

$$V(r) = \frac{I_l(r_0)\frac{\rho_S}{2\pi}[BesselK(0, \sqrt{\rho_S \sigma_J} \cdot r_w) - BesselK(0, \sqrt{\rho_S \sigma_J} \cdot r)] + {}$$

-continued $$I_l(r_0) \frac{\rho_S}{2\pi} \frac{BesselK(1, \sqrt{\rho_S \sigma_J} \cdot r_w)}{BesselI(1, \sqrt{\rho_S \sigma_J} \cdot r_w)} \cdot$$

$$[BesselI(0, \sqrt{\rho_S \sigma_J} \cdot r) - BesselI(0, \sqrt{\rho_S \sigma_J} \cdot r_w)] + V(r_w)$$

The equations Eq. 2 and Eq. 3 can also be solved for $I_l(r)$ as:

$$I_l = r \cdot \sqrt{\rho_S \sigma_J} \cdot I_l(r_0) \cdot BesselK(1, \sqrt{\rho_S \sigma_J} \cdot r) - \quad \text{Eq. 5}$$
$$r \cdot \sqrt{\rho_S \sigma_J} \cdot I_l(r_0) \cdot \frac{BesselK(1, r_w\sqrt{\rho_S \sigma_J})}{BesselI(1, r_w\sqrt{\rho_S \sigma_J})} BesselI(1, \sqrt{\rho_S \sigma_J} \cdot r)$$

These solutions are subject to the boundary conditions that the probe is at or near the center of the wafer 12 containing the implanted layer 82 and the junction leakage current $I_l(r_w)$ is negligible at the wafer edge, $r=r_w$. The total current measured 48 through the probe needle $18_1$ will be $I_l(r_0)$, where $r_0$ is the radius of the contact area of the grounded probe needle $18_1$.

In the preferred embodiments of the present invention, the probe assembly 16 will be moved to place the probe needles 18 in contact with a selected location on the surface of the implanted layer 82. The conventional four-point probe adapter 26 will then be enabled via switch 24 to measure the sheet resistivity of the implanted layer 82 at the location of the probe needles 18. Without lifting the probe needles 18 via the probe assembly 16, the switch 24 will be selected by the computer 20 to enable use of the modified four-point probe adapter 28. The voltage source 66, previously open circuited, is connected through the switch 24 to the substrate 84, enabling application of a precise bias potential across the junction 86 under control of the computer 20.

Figure 4:
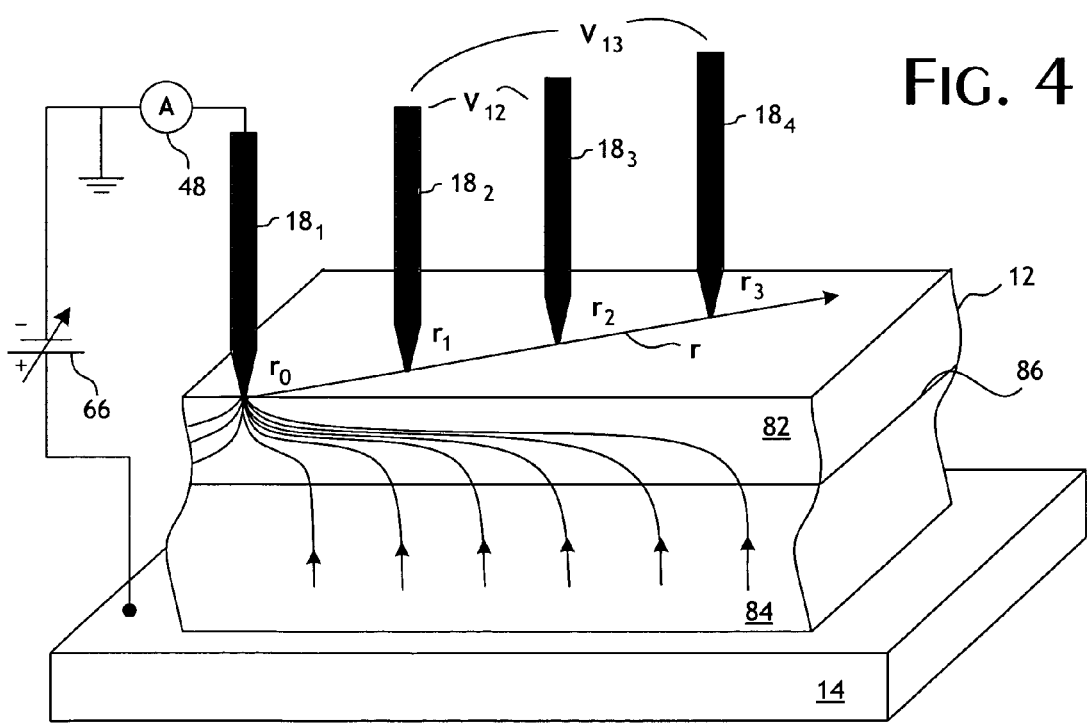
FIG. 4 provides a second isometric view of a wafer mounted for test and measurement of sheet resistivity and junction leakage in accordance with the present invention.

Referring to FIG. 4, to determine junction leakage current, the leakage current $I_l(r_0)$ is measured through probe needle $18_1$. Differential voltages are measured between probe needle $18_1$ and probe needles $18_2$ and $18_3$, defining voltage drops V12 and V13. By substituting the measure values $I_l(r_0), \rho_S, r_1$, and $r_w$ into Eq. 4, $V(r_1)-V(r_w)$ can be obtained as a function of $\sigma_J$, representing the leakage current for the junction 86. $V(r_2)-V(r_w)$ can be similarly obtained as a function of $\sigma_J$. Subtracting $V(r_1)-V(r_w)$ from $V(r_2)-V(r_w)$ yields V12 as a function of $\sigma_J$. Since V12 is a measured value, $\sigma_J$ can then be directly computed. Similarly, $\sigma_J$ can be computed from the measured V13 value to optionally validate the computed value of $\sigma_J$.

Where the value of $\sigma_J$ is relatively small (less than about $10^{-3}$ S/cm$^2$) the return current $I_l(r_0)$ can be too small for the differential voltages V12 or V13 to have enough magnitude for good measurement. In this case, $\sigma_J$ can be determined with greater accuracy by using the measured return current $I_l(r_0)$, the voltage V1, measured at probe needle $18_1$, relative to the ground potential, and $\rho_S$ to substitute into Eq. 6 to obtain $\sigma_J$:

$$I_l(r_0) = \pi r_w^2 \sigma_J [(V_S - V1 - V(r_l)] + 2\pi \sigma_J \int_{r_l}^{r_w} rV(r)dr \quad \text{Eq. 6}$$

where $I_l(r_0)$ is the current measured at the N0 probe needle $18_1$, the voltage V1 is the voltage, with respect to the ground potential, measured at N1 probe needle $18_2$, V(r1) is the expression for V(r) in Eq. 4 at $r=r_1$, where $r_w$ is the radius of the wafer 12, $r_1$ is the distance between the N1 probe needle $18_2$ and the N0 probe needle $18_1$.

Eq. 6 is based on the principle that the total current leakage through the whole junction 86 is equal to the integration of leakage current in each incremental circumference. The basis for using V12 or V13 and other parameters to determine $\sigma_J$ is that the voltage change near the current probe is dependent on the local leakage. Where the value of $\sigma_J$ is relatively large (greater than about $10^{-3}$ S/cm ), the measured differential voltages V12 and V13 provide sufficient resolution to determine $\sigma_J$ with reasonable accuracy by substitution along with $\rho_S$ into Eq. 5. The junction leakage $\sigma_J$ measured this way usually is metal film to semiconductor contact conductivity.

Thus, a system and methods for accurately measuring sheet resistivity, junction leakage current, contact conductivity, and similar parameters in relation to ion implanted, deposited and grown films and semiconductor layers have been described. In view of the above description of the preferred embodiments of the present invention, many modifications and variations of the disclosed embodiments will be readily appreciated by those of skill in the art. It is therefore to be understood that, within the scope of the appended claims, the invention may be practiced otherwise than as specifically described above.

The invention claimed is:

1. A method of measuring sheet resistance and junction leakage associated with a semiconductor layer formed at a surface of a wafer, said method comprising the steps of:
   a) contacting a surface of a semiconductor layer with a plurality of probes in a predetermined mechanically distributed pattern, said plurality of probes being electrically coupleable to a computer system;
   b) first determining, by said computer system with respect to said plurality of probes, a sheet resistivity value for said semiconductor layer;
   c) second determining, by said computer system with respect to said plurality of probes, a junction leakage value associated with said semiconductor layer, said second determining step including the steps of:
      i) establishing a reverse bias voltage potential across a junction between said semiconductor layer and said wafer, wherein said reverse bias voltage potential is set at a predetermined voltage value;
      ii) measuring, through a first probe of said plurality of probes, a current conduction value for said junction;
      iii) measuring, through second, third and fourth probes of said plurality of probes, a plurality of voltage differential values, wherein said junction leakage value is computed based on said sheet resistivity value, said current conduction value, and said plurality of voltage differential values.

2. The method of claim 1 wherein said junction leakage value is computed based on a differencing of a plurality of voltage differentials measured at predetermined offsets from an approximate center of said wafer, said plurality of voltage differentials including voltage differentials measured between said second and third and said second and fourth probes of said plurality of probes.

3. The method of claim 2 wherein said plurality of voltage differentials are dependent on the sheet resistivity of said semiconductor layer and the distance between said plurality of probes.

4. The method of claim 3 wherein said plurality of probes are distributed on a common radial line of said wafer and wherein said step of second determining is repeated for a plurality of radial lines.

5. The method of claim 3 wherein said semiconductor layer is defined by an ultra shallow junction established less than about 1000 angstrom below said surface and wherein said reverse bias voltage potential is in the range of 100 millivolts to five volts.

6. The method of claim 5 wherein said ultra shallow junction is established less than about 500 angstrom below said surface and wherein said reverse bias voltage potential is in the range of 100 millivolts to three volts.

7. A method of directly measuring the current conductivity of a semiconductor interface formed on a test wafer for the in-process characterization of a fabrication process that requires current conductivity within a predetermined range, wherein the current conductivity is the contact conductivity through a metal film to semiconductor layer interface and junction leakage between semiconductor layers of opposite conductivity type, said method comprising the steps of:
   a) providing a plurality of probes in contact with a first predetermined layer surface overlying a semiconductor interface formed at a second predetermined layer surface;
   b) measuring a current established through a first probe of said plurality of probes in response to application of a predetermined bias voltage across said semiconductor interface;
   c) measuring, through a second probe of said plurality of probes in contact with said first predetermined layer surface at a predetermined distance from said first probe, a differential voltage
   d) computing, based on said current, said predetermined bias voltage, the area of said first probe in contact with said first predetermined layer surface, and the sheet resistivity of first predetermined layer, a current conductivity for said semiconductor layer interface.

8. The method of claim 7 wherein said step of computing determines current conductivity as a junction leakage value $\sigma_J$ in accordance with $$I_l(r_0) = \pi r_w^2 \sigma_J [(V_S - V1 - V(r_1)] + 2\pi\sigma_J \int_{r_1}^{r_w} rV(r)\,dr$$

where $I_l(r_0)$ is the current measured through said first probe, $r_0$ is the contact area of said first probe, $r_w$ is the radius of said wafer, $r_1$ is the distance between said first and second probes, $\rho_S$ is the sheet resistivity of said first predetermined layer, V1 is the voltage measure at said second probe, $V_S$ is said predetermined bias voltage, and $V(r_1)$ is determined in accordance with $$V(r_1) = \frac{I_l(r_0)\frac{\rho_S}{2\pi}[BesselK(0, \sqrt{\rho_S\sigma_J}\cdot r_w) - BesselK(0, \sqrt{\rho_S\rho_J}\cdot r)] +}{}$$
$$I_l(r_0)\frac{\rho_S}{2\pi}\frac{BesselK(1, \sqrt{\rho_S\sigma_J}\cdot r_w)}{BesselI(1, \sqrt{\rho_S\sigma_J}\cdot r_w)} \cdot$$
$$[BesselI(0, \sqrt{\rho_S\sigma_J}\cdot r) - BesselI(0, \sqrt{\rho_S\sigma_J}\cdot r_w)].$$

9. The method of claim 8 wherein said first predetermined layer is a metal film layer.

10. The method of claim 8 wherein said first predetermined layer is a silicide layer.

11. The method of claim 8 wherein said first predetermined layer is a semiconductor layer of opposite conductivity type relative to said second predetermined layer.

12. A modified four-point probe system adapted to accurately measure junction leakage on ultra-shallow junction test wafers and contact conductivity on metal film test wafers, wherein a four-point probe assembly provides for the mechanical placement of an array of probe needles in contact with a surface of a semiconductor wafer, wherein a four-point probe adapter is electrically connected between said array and a computer to enable measurement and computation of the sheet resistivity of a contact layer at said surface of said semiconductor wafer, wherein the improvement comprises:
   a) a modified four-point probe adapter coupled to said computer including a precision current integrator coupleable to a first probe of said array, a precision differential voltage amplifier having a first input coupleable to a second probe of said array and a second input selectively coupleable to third and fourth probes of said array and to a ground potential;
   b) a precision bias potential source coupleable to said semiconductor wafer, said precision bias potential source being controlled by said computer; and
   c) a switch provided between said array and said four-point probe adapter providing for the selective electrical connection of said array to said modified four-point probe adapter, said switch further provided between a contact electrically coupleable to said semiconductor wafer and said precision bias potential source, said switch being controlled by said computer;
   wherein said computer is operative to compute the sheet resistivity $\rho_S$ of a surface layer and current conductivity $\sigma_J$ through said surface layer junction based on predetermined mechanical properties of said array, the applied bias potential by said precision bias potential source, and the differential voltages measured by said precision differential voltage amplifier.

13. The modified four-point probe system of claim 12 wherein said surface layer is an ultra-shallow junction layer of opposite conductivity type relative to an underlying semiconductor layer, wherein said precision bias potential source is adjustable in response to said computer to apply a reverse bias potential of between about 100 millivolts and five volts across a junction formed between said ultra-shallow junction layer and said underlying semiconductor layer, and wherein said current conductivity corresponds to the junction leakage conductivity $\sigma_J$ associated with said ultra-shallow junction layer.

14. The modified four-point probe system of claim 13 wherein said junction leakage conductivity $\sigma_J$ is computed dependent on a differencing of the differential voltage potential measured between said second and third probes and between said second and fourth probes.

15. The modified four-point probe system of claim 14 wherein said ultra-shallow junction layer is less than about 1000 angstroms in thickness.

16. The modified four-point probe system of claim 12 wherein said surface layer is a metal layer and wherein said precision bias potential source is adjustable in response to said computer to establish, dependent on the ohmic resistivity of said semiconductor wafer, a current through said surface layer.

17. The modified four-point probe system of claim 16 wherein said current conductivity $\sigma_J$ is computed dependent on a differential voltage potential measured between said first and second probes, the radius of said semiconductor wafer, and an integral value representing the current conductivity contribution for a radial width spanning between said second probe, relative to said first probe, and the radial edge of said semiconductor wafer.

* * * * *